(12) United States Patent
Quesenberry

(10) Patent No.: US 6,414,612 B1
(45) Date of Patent: Jul. 2, 2002

(54) ENHANCED BANDWIDTH DIGITIZER USING MULTIPLE ANALOG-TO DIGITAL CONVERTERS AND SELF CALIBRATION

(75) Inventor: Paul E. Quesenberry, Marietta, GA (US)

(73) Assignee: Scientific-Atlanta, Inc., Lawrenceville, GA (US)

( * ) Notice: Subject to any disclaimer, the term of this patent is extended or adjusted under 35 U.S.C. 154(b) by 0 days.

(21) Appl. No.: 09/661,851

(22) Filed: Sep. 14, 2000

(51) Int. Cl.⁷ .............................. H03M 1/06; H03M 1/10
(52) U.S. Cl. ........................................ 341/120; 341/118
(58) Field of Search ........................... 341/118, 120, 341/122; 348/163; 380/206; 375/222, 347; 342/174, 387; 327/94, 307; 370/346; 702/76

(56) References Cited

U.S. PATENT DOCUMENTS

| | | | | |
|---|---|---|---|---|
| 4,561,019 A | * | 12/1985 | Lizzi et al. | 348/163 |
| 4,839,652 A | * | 6/1989 | O'Donnell et al. | 341/122 |
| 5,262,957 A | * | 11/1993 | Hearn | 702/76 |
| 6,037,898 A | * | 3/2000 | Parish et al. | 342/174 |
| 6,081,214 A | * | 6/2000 | Morisson et al. | 341/120 |
| 6,081,215 A | * | 6/2000 | Kost et al. | 341/120 |
| 6,340,883 B1 | * | 1/2002 | Nara et al. | 324/76.78 |

* cited by examiner

*Primary Examiner*—Patrick Wamsley
(74) *Attorney, Agent, or Firm*—Hubert J. Barnhardt, III; Kenneth M. Massaroni; Shelley L. Couturier

(57) ABSTRACT

Systems and methods for digitizing broadband signals using multiple analog-to-digital converters (ADCs) and a calibration system for adjusting the phase and bias of the sampled signal such that the output digitized, sample closely approximates the input broadband analog signal. A calibration signal is combined with the broadband signal and the combined signal is converted to digital. The combined signal splits into portions equal to the number of ADCs in the system. An off-line digital signal processor (DSP) analyzes samples representing a portion of the combined signal and computes any necessary adjustments to phase and amplitude of the digitized samples. If adjustments are required, a real-time DSP adjusts the phase and amplitude of the digitized sample, by use of a multiplier and/or adder included in the real-time DSP. The separate portions of the digitized sample are recombined by a multiplexer to create a single digitized output representing the broadband analog signal.

21 Claims, 3 Drawing Sheets

ENHANCED BANDWIDTH DIGITIZER USING MULTIPLE ANALOG-TO DIGITAL CONVERTERS AND SELF CALIBRATION

FIELD OF THE INVENTION

This invention applies generally to the digitization of analog signals, and more particularly, to systems and methods for digitizing broadband transmission signals using multiple analog-to-digital converters and self calibration.

BACKGROUND OF THE INVENTION

Typical community area or cable television (CATV) systems use distribution amplifiers throughout the transmission system to amplify broadband television signals.

The broadband television signals are transmitted over the distribution network from a headend in a downstream direction to subscribers. More complex CATV systems also include a reverse signal path from the subscribers to the headend. The reverse channel is generally used for system control, messaging, monitoring, pay-per-view events, video-on-demand, and other interactive television services. These two-way transmission systems generally use one spectrum of frequencies for forward transmissions (headend to subscriber) and another spectrum of frequencies for reverse transmissions (subscriber to headend). These systems typically use the higher of the frequency bands for forward transmissions and the lower frequency bands for reverse transmissions. Forward transmissions, for example, have generally been provided in the 54 to 550 Mhz band. Reverse transmissions have generally been provided in the 5 to 30 Mhz band.

Broadband communication systems, such as cable television (CATV) systems often utilize analog-to-digital converters (ADCs) to convert broadband analog signals to a digital format. Existing ADCs, however, have limitations and may not achieve the best digital approximation of the analog signal. To date, ADC manufacturers have been unable to successfully support effective digital conversions in higher frequency systems, such as those in the European market. Thus, the current cost, speed, and quality of conventional ADCs limit their effectiveness in applications, such as reverse CATV systems, that require the digitization of broadband signals.

One approach for achieving faster sampling rates while still maintaining good signal integrity is to use multiple lower cost ADCs in cooperation. The existing ADCs, working together in a system, can digitize a signal of greater bandwidth and with better integrity than could any one of the existing ADCs alone. This is accomplished by splitting the signal and applying it to separate ADCs. Each ADC then samples the signal in turn. The net sampling rate is the sampling rate of the individual existing ADCs multiplied by the number of ADCs working in cooperation. For example, if a sampling rate of $2f_s$ is desired (where the sampling rate of each ADC is $f_s$, the signal is split and applied to two different ADCs. Each ADC performs with sufficient linearity at the sampling rate of $f_s$, but would have insufficient linearity at a sampling rate of $2f_s$. If, however, each ADC samples at $f_s$, the ADC output signals can be recombined to provide an effective sampling rate of $2f_s$. Thus, a wider bandwidth signal can be digitized by using parallel path ADCs.

Use of multiple ADCs can, however, create problems. Most of these problems result from splitting the original signal, since varying environmental conditions, path delays, and timing issues can cause discrepancies between the signals on the parallel signal paths. For instance, one of the parallel signal paths may have more loss and/or greater delay than another. Further, the sampling clocks of the ADCs may have different delays so that the relative sampling times of the converters are less than ideal, causing further distortion. In addition, the individual ADCs may have different DC offsets.

Considering the high sampling rates and resolutions required for CATV applications, the conventional approach of interleaving samples using multiple ADCs imposes extremely rigid tolerances on circuits and components preceding the ADCs, on clocking components and layout, and on the ADCs themselves. The strict tolerances on these components are required to ensure that each ADC samples the signal in exactly the right phase relative to the other ADC(s). Furthermore, the gains or losses in each analog path must be precisely matched. A precise calibration procedure and manual adjustments are required to match various delays, gains, losses, and offsets. Once these conditions are met, there is still the possibility that the performance by the digitizer will degrade as component values change due to temperature variations, aging, or other environmental concerns. Such systems with sufficient stability and performance may be realizable for some applications, but the cost would be too great for many applications, such as typical reverse path CATV applications.

Thus, a need exists for lower cost, durable, stable systems and methods for achieving higher quality sampling of broadband analog signals at faster rates.

DETAILED DESCRIPTION

Figure 1:
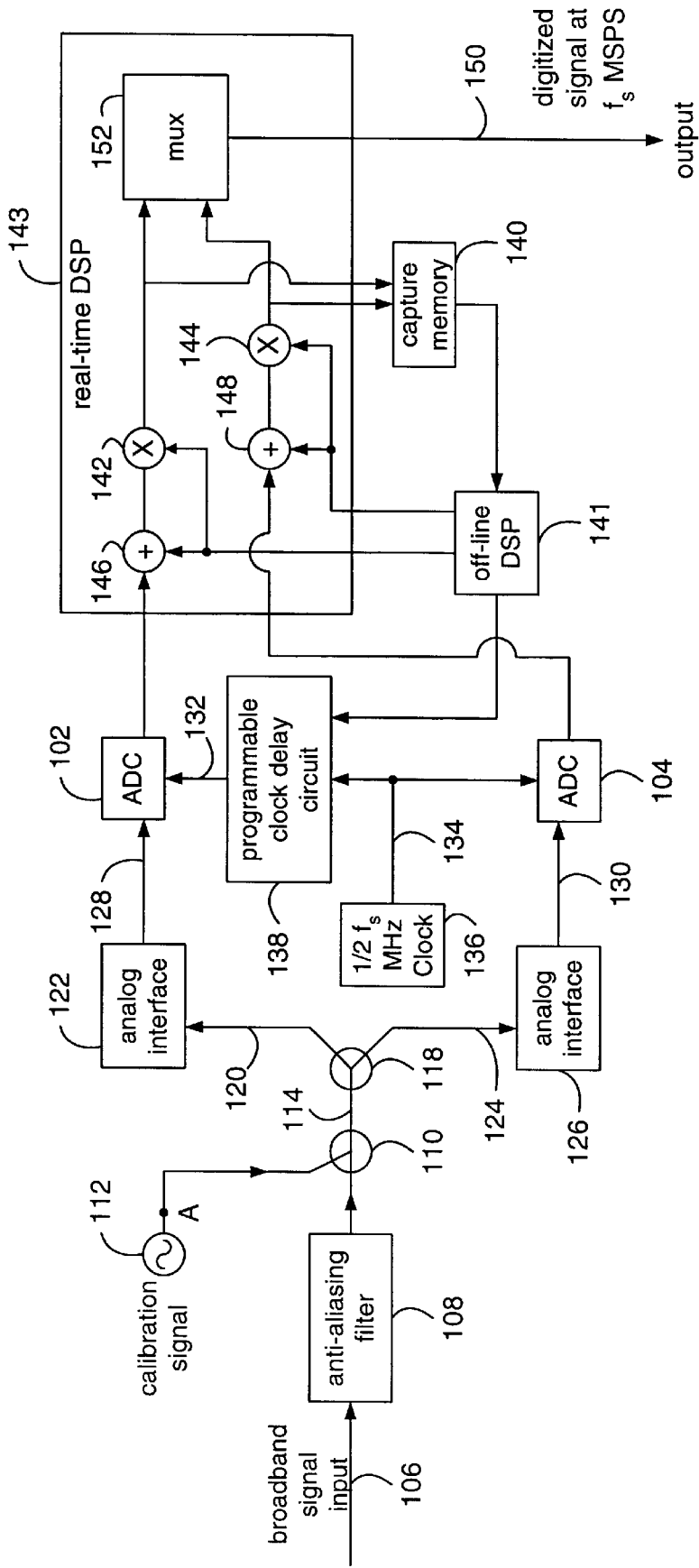
FIG. 1 is a block diagram illustrating a system for converting a broadband signal from an analog format to a digital format using two analog-to-digital converters in accordance with the present invention.

FIG. 1 is a block diagram illustrating a system 100 using multiple analog-to-digital converters (ADCs) 102, 104 to perform interleaved sampling of a signal. It is assumed that a sampling ADC 102, 104 is available having a sufficiently low distortion up to sampling speeds of $\frac{1}{2}f_s$, where $f_s$ is the desired sampling speed for a given application. Suitable standard ADCs are provided by, for example, Analog Devices, Inc. of Massachusetts, U.S.A. Two ADCs 102, 104 are shown in the system 100 of FIG. 1; however this invention is not limited to the use of two ADCs 102, 104, as will be explained in greater detail below.

A payload signal 106 (also referred to as a broadband signal) to be digitized at $f_s$ MSPS (mega samples per second) is provided to an anti-aliasing filter 108 (e.g., a bandpass or lowpass filter) and is forwarded to a directional coupler 110. The directional coupler 110 combines the filtered signal with a calibration signal 112 provided at terminal A, which may be coupled to an internal or external signal source for producing a calibrated signal. Preferably, the frequency of the calibration signal 112 is different from the frequency or frequencies of the signals provided at input 106.

In the United States, reverse band signals in broadband communication systems, such as CATV systems, are typically transmitted in the frequency range from 5 to 40 MHz. In European markets, reverse path signals typically occupy the spectrum from 5 to 65 MHz. Therefore, when the system 100 is included within the reverse path of a broadband communication system, the frequency of the calibration signal 112 is preferably set so that it does not overlap the frequency spectrum of the reverse path signal 106. More specifically, the calibration signal may be set to operate from, for example, 0–5 MHz, above 40 MHz in Uited States systems, or above 65 MHz in European systems.

In the simplest implementation of this invention, the calibration signal 112 is merely a continuous wave carrier, such as a sine wave, having a frequency outside that of the payload signal band. Alternatively, the frequency of the calibration signal 112 may be within the payload signal band and/or be switched on and off as needed.

The combined payload and calibration signals 114 are provided to the splitter 118, which directs half of the signal energy 120 analog circuitry of analog interface 122 and half of the signal energy 124 through analog interface 126. The analog circuitry blocks 122, 126 have similar gains, losses, and delays; however, in practice, there are likely to be differences between the two blocks due to component and layout variations.

The signal 128 passing through an analog interface 122 is digitized by ADC 102, which operates at ½$f_s$, MSPS. The analog interface 122 can include a transformer coupler or any suitable network of resistors and capacitors capable of performing impedance matching to eliminate reflections at the input of the ADC 102. The signal 130 passing through analog interface 126 is digitized by ADC 104, which also operates at ½$f_s$, MSPS.

A clock circuit 136 provides a clock signal 134 for clocking the ADCs 102, 104. Nominally, the clock signal 132 arriving at ADC 102 will lag the clock signal 134 arriving at ADC 104 by 180 degrees. However, the signal samples acquired at ADC 102 will not generally be precisely 180 degrees shifted from the signal samples acquired at ADC 104 because of differences in the analog interface blocks 122, 126 and because of differences in the clock and analog paths inside the ADCs 102, 104. The system of FIG. 1 produces, at its output 150, a combined signal comprising samples that were acquired periodically at a rate of $f_s$, MSPS. Thus, ADC 102 should acquire its sample precisely 180 degrees after ADC 104 acquires its sample so that the two digitized signals are precisely phased for combination back into a single signal. This is accomplished by adjusting the arrival time of the clock signal 132 at ADC 102 to precisely compensate for differences in the parallel signal paths, differences in the clock paths to the ADCs 102, 104, and differences internal to the ADCs 102, 104. A programmable delay circuit 138 is used to effect the delay of the clock signal 132 before it reaches ADC 102.

A capture memory 140 captures a block of data at a real-time data rate until a sufficient number of samples have been collected from the ADCs 102, 104. The capture memory 140 holds the captured data and passes samples to a low-cost, off-line digital signal processor (DSP) 141 as needed. A suitable off-line DSP is available from, for example, Texas Instruments or Analog Devices. An algorithm (i.e., software of the DSP 141) in the DSP 141 isolates the calibration signal 112 in each stream and computes the phase, amplitude, and offset differences between the two signal paths at the outputs of the ADCs 102, 104.

The DSP 141 uses the phase information to adjust the clock delay 138-until the phase difference is precisely 180 degrees. The DSP 141 uses the amplitude and offset information to compute correction parameters applied to the adders 146, 148 and multipliers 142, 144 in the real-time DSP block 143. The calibration routine of the DSP 141 runs at frequent intervals to ensure that adjustments to the clock delay 138, multiplier coefficients, and added offsets are maintained, thereby providing optimum performance over time. A suitable clock delay circuit 138 is available from, for example, Synergy. Numerous methods for implementing a clock delay circuit will, however, be apparent to one of ordinary skill in the art.

The real-time DSP 143 includes multipliers 142, 144, adders 146, 148, and a multiplexer (mux) 152. Suitable real-time DSPs 143 include application specific integrated circuits (ASICs) and field programmable gate arrays (FPGAs), which are integrated circuit chips having digital circuits and that can be programmed by a technician. Suitable DSPs are available, for example, from Altera Corporation of California, U.S.A. and from Lattice, Inc. of Illinois. It will be appreciated that, if the DC offsets of the analog interfaces 122, 126 and the ADCs 102, 104 are small enough, either or both of the adders 146, 148 may be unnecessary.

The mux 152 interleaves the data to produce a final output stream 150.

The off-line DSP 141 performs as a calibrator and calculates adjustments required to be applied to samples. For example, the DSP 141 can isolate the calibration signal 112 from each ADC 102, 104, compute phase and amplitude relationships, determine the prescribed phase adjustment to be applied to the programmable clock delay circuit 138, and determine the multiplier and/or adder coefficients applied to each multiplier 142, 144 and/or adder 146, 148. It will be appreciated that the functions of DSP 141 could instead be performed using real-time processing; however, due to costs, power consumption, and heat dissipation concerns, it is advantageous to divide the DSP functions into real-time and non-real-time functions as shown. The DSP 141 uses the amplitude information to adjust the multiplier constants of the multipliers 142, 144 until the amplitudes of the streams are equal. In addition to examining the relative phase and amplitudes of the streams, the DSP 141 also measures the DC bias of each stream and computes a correction for each stream, which is applied to the real-time data stream via adders 146, 148 to provide DC biasing-adjustments.

In summary, the samples stored in the capture memory 140 are processed by the DSP 141 to isolate the calibration signals acquired through the ADC 102, 104. The clock delay circuit 138 and the multipliers 142, 144 must be set so that the versions of the calibration signal 112 arriving through the ADCs 102, 104 are 180 degrees out of phase and the amplitudes identical. The DSP 141 computes the delay adjustment needed at the clock delay circuit 138 by examining the phase difference in the calibration signals arriving through the two different paths. The DSP 141 also computes the gain factors that must be applied at multipliers 142, 144 so that the calibration signals arriving through the two different paths have the same amplitude.

Once the DSP 141 has computed the required delay utilizing the clock delay circuit 138, implemented any required gains from the multiplier 142, 144, and applied the values to the adders and multipliers, the data appearing at the output 150 of mux 152 will be samples that have been periodically sampled precisely periodically at a rate of $f_s$, MSPS. Thus, by providing the calibration signal 112 outside the payload signal band 106, the DSP 141 can continuously monitor and update the clock delay, gains factors, and additive offsets to maintain optimum performance.

Figure 2:
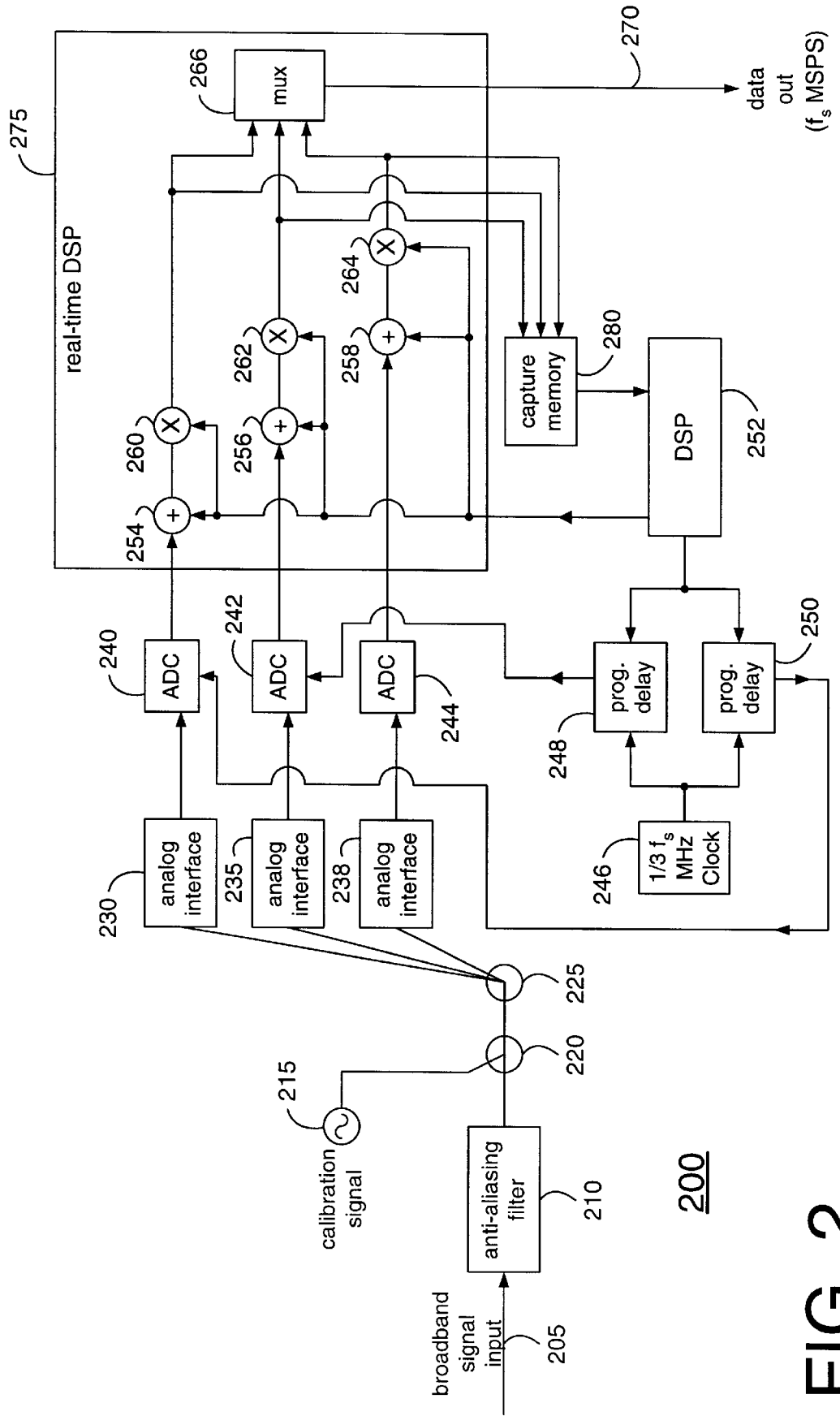
FIG. 2 is a block diagram illustrating a system for converting a broadband signal from an analog format to a digital format using multiple analog-to-digital converters in parallel paths in accordance with the present invention.

This invention can be implemented utilizing more than two ADCs. FIG. 2 shows a system 200 that uses more than two ADCs to increase the sampling speed. Specifically, FIG. 2 depicts an example of an embodiment using three ADCs 240, 242, 244. An input signal 205 is filtered by anti-aliasing filter 210, combined by combiner 220 with a calibration signal 215, and split by splitter 225 to provide three signals, each including approximately one-third of the signal energy. Each signal is processed by an analog interface 230, 235, 238 and provided to an ADC 240, 242, 244.

Within the system 200, a clock circuit 246 provides a clock signal at ⅓ $f_s$ MHz, since three ADCs are utilized in this embodiment and since the desired output is a digital signal 270 having a sampling rate of $f_s$, MSPS. Two programmable clock delay blocks 248, 250 are used to delay the clock signal provided to ADC 240 by one-hundred-twenty (120) degrees and to delay the clock signal provided to ADC 242 by two-hundred-forty (240) degrees. Adder 254 and multiplier 260 perform respective summing and multiplying operations on the signal provided by ADC 240; adder 256 and multiplier 262 perform respective summing and multiplying operations on the signal provided by ADC 242; and adder 258 and multiplier 264 perform respective summing and multiplying operations on the signal provided by ADC 244. The three summed and multiplied signals are then provided to multiplexer 266 for interleaving into a single digital output signal 270. The adders 254, 256, 258, the multipliers 260, 262, 264, and the mux 266 may be included in an FPGA, an ASIC, or a programmable logic device (PLD), for example.

The capture memory 280 stores data acquired from each ADC 240, 242, 244 and is referenced by DSP 252. As in the embodiment described in reference to FIG. 2, the DSP 252 adjusts multiplier coefficients, DC offsets, and clock delay time so that the three signal streams can be accurately combined by the mux 266, which provides the digital output signal 270 at $f_s$ MSPS.

It will be appreciated that the number N of parallel-path ADCs used in a digitizing system in accordance with the present invention is determined by the desired data rate of the system output signal. In the digitizing system, given an output data rate of $f_s$, the sampling rate of each ADC will be $f_s/N$, and each ADC will be clocked at this speed. A first of the ADCs should be clocked with no delay, and clock delays for the remainder of the ADCs should be set to provide delays at intervals of 360/N degrees.

By way of example, if N=6 (i.e., if six ADCs are to be used in parallel paths), the clock signal provided to the first ADC will not be delayed. The clock signal for second ADC will be delayed by 360/6, or 60, degrees; the clock signal for the third ADC will be delayed by 120 degrees; the clock signal for the fourth ADC will be delayed by 180 degrees; the clock signal for the fifth ADC will be delayed by 240 degrees; and the clock signal for the sixth ADC will be delayed by 300 degrees. The DSP that controls the clock delay circuits could, for instance, set the delay circuits to delay by set amounts of time and simply adjust the timing for each until the output streams from the ADC are phased for proper interleaving.

By way of example, if N=6 (i.e., if six ADCs are to be used in parallel paths), the clock signal provided to the first ADC will not be delayed. The clock signal for second ADC will be delayed by 180/6, or 30, degrees; the clock signal for the third ADC will be delayed by 60 degrees; the clock signal for the fourth ADC will be delayed by 90 degrees; the clock signal for the fifth ADC will be delayed by 120 degrees; and the clock signal for the sixth ADC will be delayed by 150 degrees. The DSP that controls the clock delay circuits could, for instance, set the delay circuits to delay by set amounts of time and simply adjust the timing for each until the output streams from the ADC are phased for proper interleaving.

In an alternative embodiment of this invention, the ADC, programmable delay circuit(s), real-time DSP, memory, and off-line DSP functionality could be integrated into a different packaging arrangements. For example, the ADCs might be integrated with the programmable clock delay circuit. In another alternative embodiment of this invention, all components could be integrated into a single package. Many variations of packaging are possible by integrating different combinations of the functions disclosed in this invention.

An advantage of this invention is that use of parallel-path ADCs permits relaxing of component tolerances, simplifies the manufacturing calibration process, and virtually eliminates concerns of degradation by temperature changes and component aging. As mentioned, these benefits are obtained by adding a calibration signal, DSP processing of samples output from the parallel ADCs, and one or more programmable clock delay circuits. The calibration signal can either be available all the time or can be switched on as needed, and the calibration routine in the DSP calibration routine runs at frequent intervals to ensure that adjustments to the delay clock, multiplier coefficients, and adders are maintained for optimum performance even as component values drift with temperature or aging.

Another advantage of this invention is that it simplifies the manufacturing process because calibration is automatic. The system calibrates itself for optimal performance when the system powers up.

Figure 3:
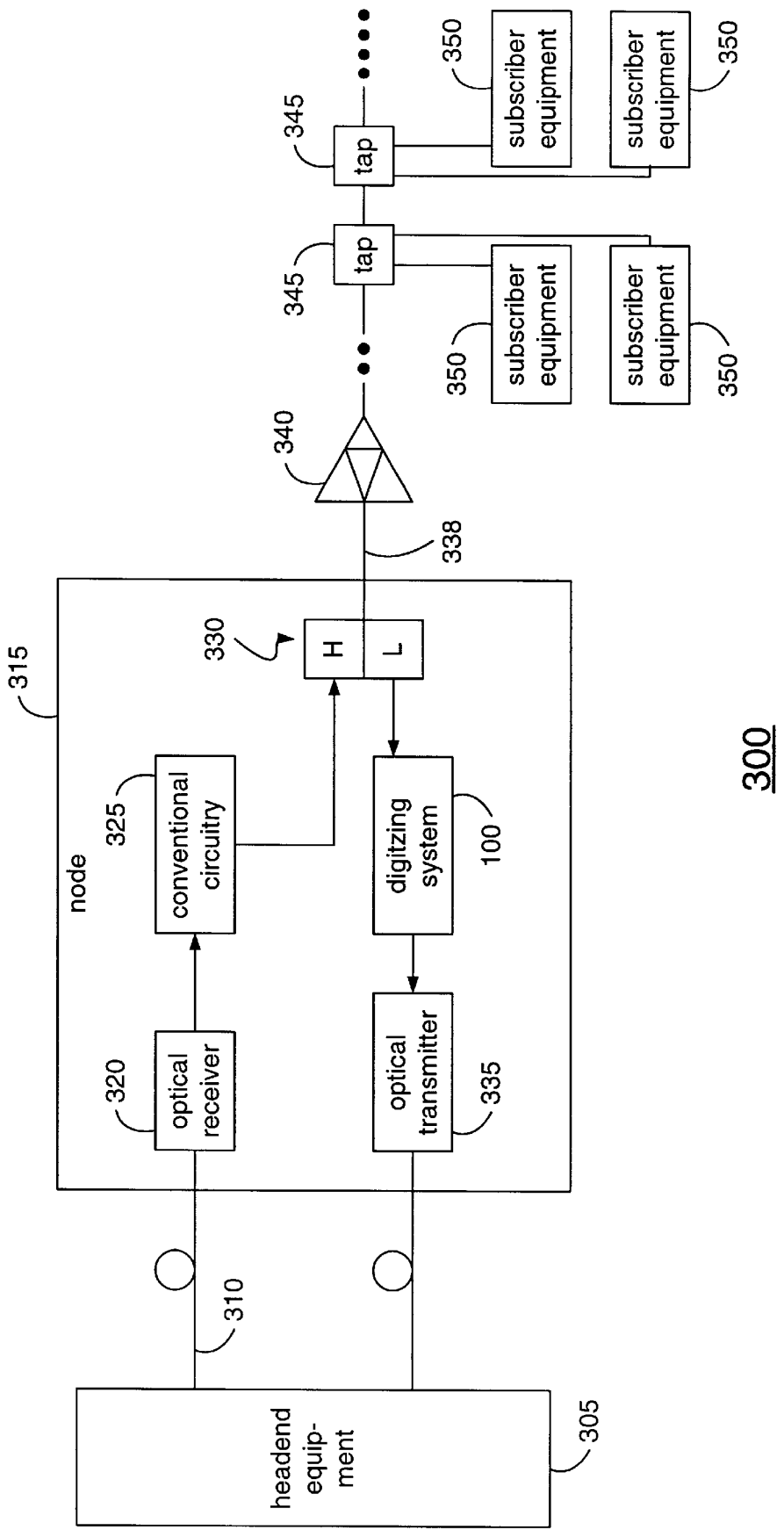
FIG. 3 is a block diagram of a broadband communication system including a reverse path in which upstream, reverse signals are processed using multiple analog-to-digital converters in parallel paths in accordance with the present invention.

The digitizing system in accordance with the present invention can be used in many types of electronic devices. By way of example, referring to FIG. 3, a broadband communication system 300 can include an optical node 315 that includes a digitizing system 200 for providing two parallel ADCs (FIG. 1) for processing a split signal as described above. The broadband communication system 300 may include a cable television headend 305 for transmitting optical signals over an optical communication medium 310, such as fiber optic cable, to a node 315. The node 315 includes an optical receiver 320 for receiving the optical signal and other conventional circuitry 325 for performing such functions as optical-to-electrical conversion, amplification, filtering, and signal adjustments. The downstream, or forward, electrical signal is filtered by diplex filter 330 and provided to other communication equipment, such as amplifiers 340, taps 345, and subscriber equipment 350.

When the broadband communication system 300 supports reverse, or upstream, communication between the subscriber equipment 350 and the node 315 or headend 305, electrical signals are provided, via the taps 345 and any distribution amplifiers 340, to the node 315 over electrical communication media 338, such as coaxial cable. The lowpass filter of the diplex filter 330 splits the lower frequency reverse signal from the higher frequency forward signal and provides the reverse signal to the digitizing system 100.

In accordance with the present invention, the digitizing system 100 splits the signal energy to provide portions of the reverse signal to N ADCs, each of which samples the signal at a rate of $f_s/N$ MSPS. The signals on the multiple parallel paths are then interleaved, as described above, to provide an output digital signal having a data rate of $f_s$ MSPS. This signal is then transmitted back to the headend 305 by an optical transmitter 335.

One of ordinary skill in the art will appreciate that the digitizing system 100 has been described as used in a communication node 315 for example purposes only. Any other system or device in which relatively fast data rates are desirable could likewise benefit from the use of the digitizing system of the present invention.

In light of the foregoing disclosure of this invention and description of certain preferred embodiments, those who are skilled in this area of technology will readily understand that various modifications and adaptations can be made without departing from the true scope and spirit of this invention. All such modifications and adaptations are intended to be covered by the following claims.

What is claimed is:

1. A method for digitizing a broadband signal, comprising:
    combining a calibration signal with the broadband signal, forming a combined signal;
    splitting the combined signal into proportions equal to a number of analog-to-digital converters;
    converting each portion of the combined signal to a digitized sample using each respective analog-to-digital converter;
    capturing the digitized sample and isolating a portion of the digitized sample representing the calibration signal;
    computing adjustments necessary to correct for delays and bias in the portion of the digitized sample representing the calibration signal;
    adjusting the digitized sample to correct the delays and bias; and
    multiplexing each portion of the digitized sample together to produce a digitized output representing the broadband signal,
        wherein the broadband signal is continuously transmitted throughout.the digitizing method.

2. The method of claim 1, wherein the computing adjustments necessary to correct for delays and bias in the portion of the digitized sample representing the calibration signal step is performed using a first digital signal processor.

3. The method of claim 2, further comprises computing by the first digital signal processor a phase adjustment required by examining a phase difference in each portion of the digitized sample representing the calibration signal.

4. The method of claim 2, further comprises computing by the first digital signal processor gain factors to be applied so that each portion of the digital sample representing the calibration signal arrive at each respective first and second analog-to-digital converters having a same amplitude.

5. The method of claim 1, further comprises adjusting a clock of a second analog-to-digital converter so that the second analog-to-digital converter samples a second portion of the combined signal one-hundred-ninety degrees after a first analog-to-digital converter samples a first portion of the combined signal.

6. The method of claim 5, wherein the clock of the second analog-to-digital converter has a programmable delay circuit to effect the delay of a clock signal from reaching the second analog-to-digital converter.

7. The method of claim 1, wherein the capturing the digitized sample and isolating a portion of the digitized sample representing the calibration signal step is performed using a capture memory.

8. The method of claim 7, further comprises processing the digitized samples stored in the capture memory to isolate the portion of digitized sample representing the calibration signal acquired through a first and second analog-to-digital converters.

9. The method of claim 1, wherein the computing adjustments necessary to correct for delays and bias in the portion of the digitized sample representing the calibration signal further comprises computing a delay adjustment required to eliminate a phase difference in the portion of the digitized sample representing the calibration signal from each analog-to-digital converter.

10. The method of claim 1, further comprising continuously monitoring each portion of the digitized sample representing the calibration signal by a first digital signal processor and correcting for delay and gains by a second digital signal processor.

11. A system for digitizing a broadband signal, comprising:
    a calibration signal for combining with the broadband signal to form a combined signal;
    a splitter for splitting the combined signal into at least two signals;
    a plurality of analog-to-digital converters (ADCs) coupled to each signal for converting each signal to a digitized sample;
    a first digital signal processor (DSP) for isolating a portion of the digitized sample representing the calibration signal and computing necessary adjustments to be implemented by a second DSP on the digitized sample;
    a clock for delaying the digitized sample and for shifting a phase of one of the ADCs at the direction of the first DSP such that a first ADC is approximately one-hundred-eighty degrees out of phase with a second ADC creating adjusted digitized samples; and
    a multiplexer for recombining the adjusted digitized samples creating a single digitized output representing the broadband analog signal.

12. The system of claim 11, wherein three combined signals are output from the splitter.

13. The system of claim 12, wherein each of the three combined signals couples to each respective analog interface.

14. The system of claim 13, further comprises an ADC coupled to each analog interface for converting each of the three combined signals into a digital sample.

15. The system of claim 14, further comprises a multiplier coupled to each ADC for adjusting the amplitude of the digital sample and an adder coupled to each ADC for adjusting a bias of the digital sample.

16. The system of claim 11, wherein the calibration signal operates between 0 and 5 MHz.

17. The system of claim 11, wherein the calibration signal operates at a frequency greater than 40 MHz.

18. The system of claim 11, further comprising a memory coupled to the first DSP and the second DSP for storing data until a sufficient number of digitized samples have been collected by the second DSP at which time the digitized samples are transferred from the memory to the first DSP for isolation and calibration.

19. The system of claim 11, wherein the clock includes a programmable clock delay circuit.

20. The system of claim 11, wherein the second DSP further comprises a multiplier for each ADC for adjusting the amplitude of each digitized sample and an adder for adjusting a bias of each digitized sample.

21. The system of claim 11, further comprising an analog interface coupled to the splitter for providing impedance matching.

* * * * *

UNITED STATES PATENT AND TRADEMARK OFFICE
CERTIFICATE OF CORRECTION

PATENT NO. : 6,414,612 B1
DATED : July 2, 2002
INVENTOR(S) : Quesenberry

It is certified that error appears in the above-identified patent and that said Letters Patent is hereby corrected as shown below:

Column 3,
Line 13, delete "Uited" and insert therefore -- United --
Lines 31 and 37, delete "½$f_s$," and insert therefore -- ½$f_s$ --
Line 46, insert a paragraph between "104." and "The"
Line 48, delete "$f_s$," and insert therefore -- $f_s$ --

Column 4,
Line 50, delete "biasing-adjustments." and insert therefore -- biasing adjustments. --

Column 5,
Lines 2 and 20, delete "$f_s$," and insert therefore -- $f_s$ --
Delete the duplicate paragraph between Column 5, Line 66 through Column 6, Line 11.

Column 7,
Line 56, delete "one-hundred-ninety" and insert therefore -- one-hundred-eighty --

Signed and Sealed this

Twenty-eighth Day of January, 2003

JAMES E. ROGAN
*Director of the United States Patent and Trademark Office*